(12) United States Patent
Yamamoto et al.

(10) Patent No.: US 8,421,115 B2
(45) Date of Patent: Apr. 16, 2013

(54) SEMICONDUCTOR MATERIAL, METHOD OF PRODUCING SEMICONDUCTOR MATERIAL, LIGHT EMITTING DEVICE AND LIGHT RECEIVING DEVICE

(75) Inventors: Kazushige Yamamoto, Yokohama (JP); Tatsuo Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 751 days.

(21) Appl. No.: 12/617,104

(22) Filed: Nov. 12, 2009

(65) Prior Publication Data
US 2010/0123165 A1 May 20, 2010

(30) Foreign Application Priority Data

Nov. 14, 2008 (JP) ................................. 2008-292211

(51) Int. Cl.
*H01L 33/16* (2010.01)
*H01L 31/0256* (2006.01)

(52) U.S. Cl.
USPC ............... 257/103; 257/461; 257/E33.003; 257/E33.013; 257/E33.037; 257/613

(58) Field of Classification Search .................. 257/461, 257/613, E33.035, E33.036
See application file for complete search history.

(56) References Cited

U.S. PATENT DOCUMENTS

| 7,446,348 | B2 | 11/2008 | Yamamoto et al. |
| 7,550,779 | B2 | 6/2009 | Yamamoto et al. |
| 2007/0145394 | A1 | 6/2007 | Shimizu et al. |
| 2007/0267711 | A1 | 11/2007 | Yamamoto et al. |
| 2008/0061369 | A1 | 3/2008 | Shimizu et al. |
| 2008/0079022 | A1 | 4/2008 | Yamamoto et al. |
| 2009/0057689 | A1 | 3/2009 | Yamamoto et al. |
| 2009/0245314 | A1 | 10/2009 | Yamamoto et al. |

OTHER PUBLICATIONS

K.J. Chang et al., "Pressure Coefficients of Band Gaps in Semiconductors", Solid State Communications, vol. 50, No. 2, 1984, pp. 105-107.

J.L. McAfee et al., "Structural and vibrational properties of {N,N} pairs and {N,H} complexes in Si", Physical Review B69, 2004, 10 pages.

*Primary Examiner* — Calvin Lee
*Assistant Examiner* — Scott Stowe
(74) *Attorney, Agent, or Firm* — Oblon, Spivak, McClelland, Maier & Neustadt, L.L.P.

(57) ABSTRACT

A semiconductor material includes a matrix semiconductor includes constituent atoms bonded to each other into a tetrahedral bond structure, and a heteroatom Z doped to the matrix semiconductor, in which the heteroatom Z is inserted in a bond so as to form a bond-center structure with an stretched bond length, and the bond-center structure is contained in a proportion of 1% or more based on the heteroatom Z.

8 Claims, 5 Drawing Sheets

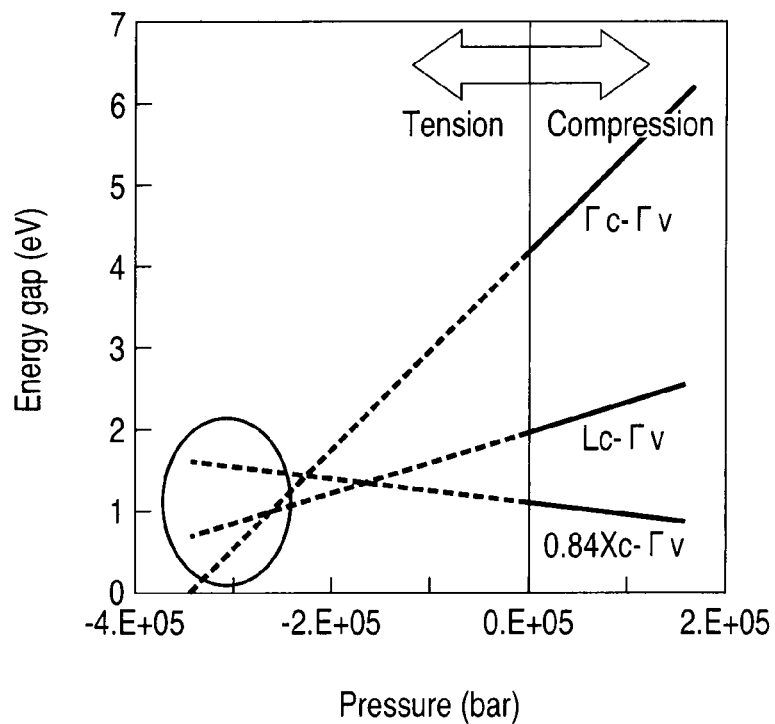
F I G. 1
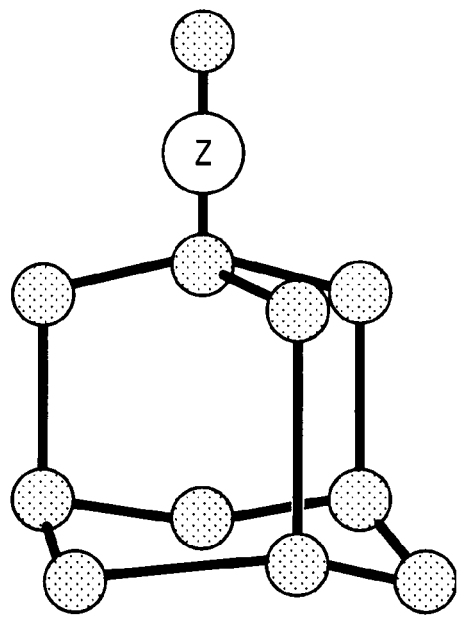
F I G. 2

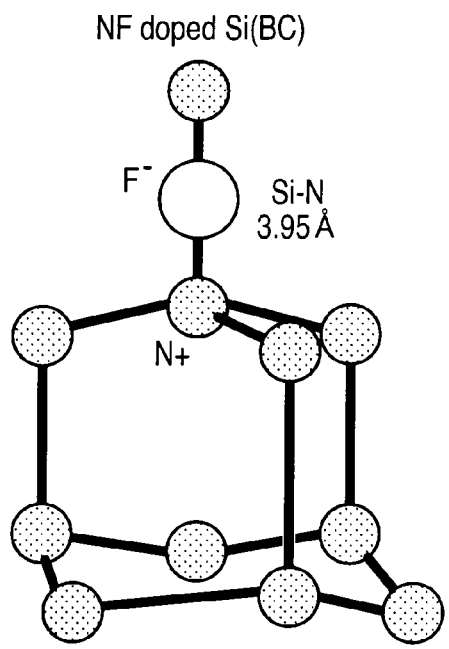
F I G. 3A
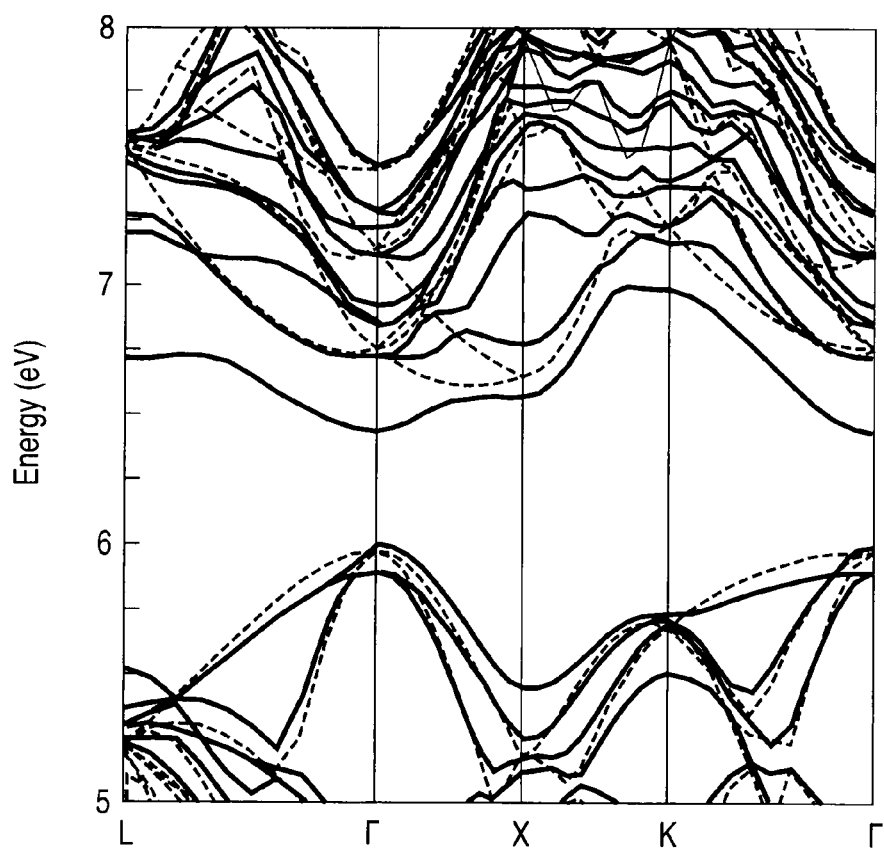
F I G. 3B

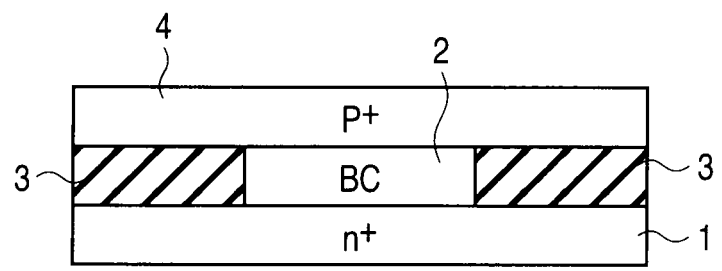
F I G. 4A
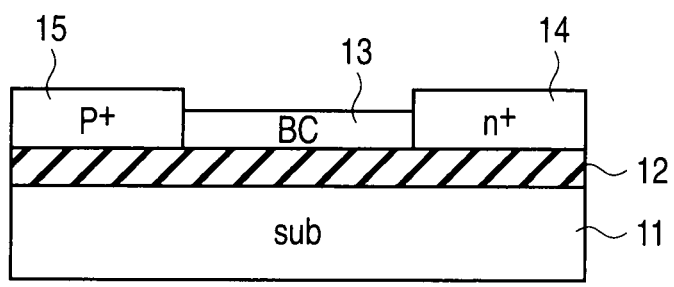
F I G. 4B

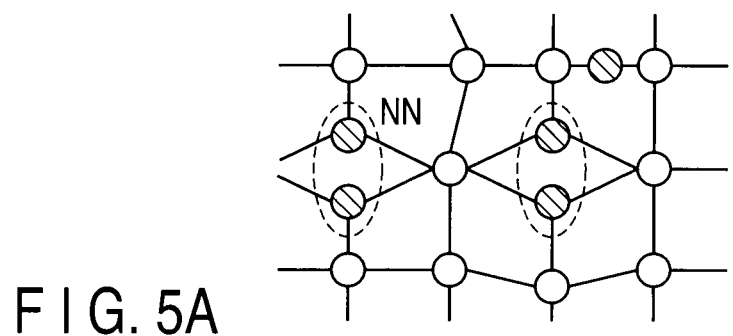
F I G. 5A
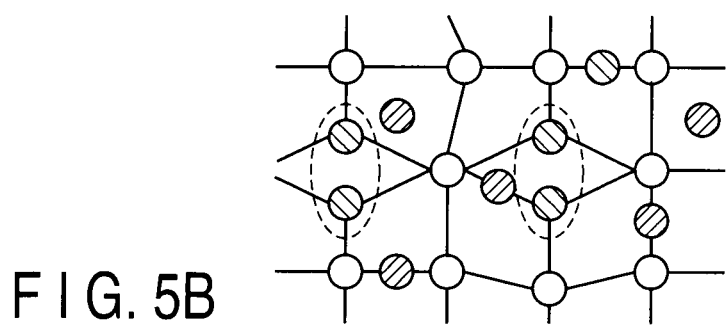
F I G. 5B
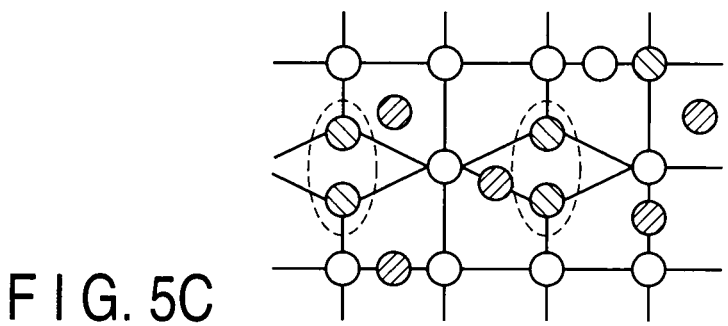
F I G. 5C

SEMICONDUCTOR MATERIAL, METHOD OF PRODUCING SEMICONDUCTOR MATERIAL, LIGHT EMITTING DEVICE AND LIGHT RECEIVING DEVICE

CROSS-REFERENCE TO RELATED APPLICATIONS

This application is based upon and claims the benefit of priority from prior Japanese Patent Application No. 2008-292211, filed Nov. 14, 2008, the entire contents of which are incorporated herein by reference.

BACKGROUND OF THE INVENTION

1. Field of the Invention

The present invention relates to an impurity-doped semiconductor material with a BC (bond-center) structure and a method of producing the same, and further relates to a light emitting device and a light receiving device.

2. Description of the Related Art

In recent years, studies regarding the band engineering intended to modulate the unique optical characteristics of a substance, such as light emission and absorption, by modulating the energy band structure having been considered as being inherent to the substance are being activated.

For example, a quantum dot (quantum wire or very thin film) is well known as a representative band engineering method. The quantum dot (quantum wire or very thin film) provides a method of reducing the size of a substance three-dimensionally (two-dimensionally or one-dimensionally) so as to confine electrons therein, thereby modulating the band structure thereof.

On the other hand, a bond stretching effect can be mentioned as providing a band engineering method in which the band structure of a semiconductor is modulated by a principle entirely different from the above. The bond stretching effect provides a method of applying a stretching stress to a substance so as to attain bond stretching, thereby modulating the band structure thereof.

FIG. 1 shows the pressure dependence of each of three energy gaps of $\Gamma c$-$\Gamma v$ (direct transition), $Lc$-$\Gamma v$ (indirect transition) and $0.84Xc$-$\Gamma v$ (indirect transition) with respect to silicon (see K. J. Chang et al., Solid State Commun. 50, 105 (1984)). The extrapolation lines shown in the figure are those calculated from the pressure coefficients appearing in the literature. The pressure coefficients of ($\Gamma c$-$\Gamma v$), ($Lc$-$\Gamma v$) and ($0.84Xc$-$\Gamma v$) are 11.6 meV/kbar, 3.8 meV/kbar and −1.6 meV/kbar, respectively.

The extrapolation lines of FIG. 1 suggest that, in a tensile pressure region, the band structure of silicon changes to the direct transition. In essence, the bottom of conduction band shifts from $0.84Xc$ to $\Gamma c$ under the tensile pressure. This result clearly suggests that, if the Si—Si bond can be stretched, the band structure of silicon can be converted to the direct transition as in compound semiconductors represented by GaAs.

However, no method of applying an external tensile pressure of several hundreds of kilobars in order to attain a bond stretching is known. Therefore, there is no example of success in the conversion of silicon to the direct transition by the bond stretching effect. In short, there is the problem that the conversion to the direct transition by the bond stretching effect is in no way a practical method.

The indirect semiconductors, including silicon, are essentially nonluminescent and exhibit weak absorption. Accordingly, up to now, it has been in principle difficult to fabricate a light emitting device based on an indirect semiconductor. Although a light receiving device based on an indirect semiconductor has been fabricated, due to a low absorption coefficient thereof, its photosensitivity and response speed have had a trade-off relationship. Namely, there has been the problem that when a thick-film device is employed for higher photosensitivity, a decrease of response speed would be invited, and that contrarily when a thin-film device is employed for higher response speed, a decrease of photosensitivity would be invited.

In summing up, the bond stretching effect would provide a novel band engineering method permitting the conversion of silicon to the direct transition, and the application thereof to the indirect semiconductors, including silicon, would work to bring about novel optical functions, such as strong luminescence and high absorption. However, there is the problem that no practical method of applying to silicon a tensile pressure on the order of several hundreds of kilobars required for the conversion to the direct transition is known.

BRIEF SUMMARY OF THE INVENTION

According to an embodiment of the present invention, there is provided a semiconductor material comprising: a matrix semiconductor comprising constituent atoms bonded to each other into a tetrahedral bond structure; and a heteroatom Z doped to the matrix semiconductor, the heteroatom Z being inserted in a bond so as to form a bond-center structure with an stretched bond length, and the bond-center structure being contained in a proportion of 1% or more based on the heteroatom Z.

According to another embodiment of the present invention, there is provided a method of producing a semiconductor material, comprising: ion-implanting a heteroatom Z to be inserted in a bond into a matrix semiconductor at such a high temperature that no diffusion of the heteroatom Z occurs, ion-implanting a heteroatom A replacing a lattice point into the matrix semiconductor at such a high temperature that no diffusion of the heteroatom A occurs, and carrying out activation annealing.

BRIEF DESCRIPTION OF THE SEVERAL VIEWS OF THE DRAWING

FIG. 1 is a graph showing pressure dependence of each of three energy gaps of $\Gamma c$-$\Gamma v$, $Lc$-$\Gamma v$ and $0.84Xc$-$\Gamma v$ in silicon;

FIG. 2 is a view illustrating the atomic arrangement of impurity-doped silicon with a BC structure;

FIGS. 3A and 3B are a view illustrating NF-doped Si with a BC structure and a band diagram thereof;

FIGS. 4A and 4B are cross-sectional views showing silicon light emitting devices of a vertical type and a lateral type according to embodiments;

FIGS. 5A to 5C are schematic views showing changes of the impurity arrangement in a method of producing an FT structure.

DETAILED DESCRIPTION OF THE INVENTION

Figure 6A:
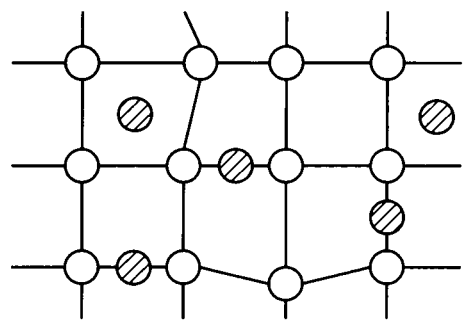
FIGS. 6A to 6C are schematic views showing changes of the impurity arrangement in the first method of producing a BC structure.

The function of impurity-doped silicon with a BC (bond-center) structure constituting the core of the present invention will be described in detail below.

(1) Impurity-Doped Silicon with a BC Structure

The atomic arrangement of impurity-doped silicon with a BC structure will be described with reference to FIG. 2. The BC structure refers to a structure in which a heteroatom (impurity atom) Z is inserted in a bond as illustrated in FIG. 2. In the present invention, this impurity atom is referred to as a bond-centered interstitial impurity.

(2) Principle of Silicon Band Modulation by Impurity Doping

Referring to FIG. 1, an extension of the Si—Si bond causes the silicon to undergo a conversion to direct transition. However, it is extremely difficult to stretch the bond by an external force, and there is no example of success so far in the conversion to direct transition by an external force.

In embodiments of the present invention, an impurity pair is introduced in a crystal lattice by impurity-doping so that an internal stress is caused to thereby attain a bond stretching, thus modulating the band structure. One of impurity pair candidates is an NF pair consisting of an N atom replacing a lattice point site and an F atom to be inserted in a bond-centered interstitial site. The description of the principle will be made hereinafter with reference to the NF pair.

Suppose that a lattice point N atom receives one electron from a bond-centered interstitial F atom. Then, the lattice point N atom comes to have the same four-coordinate bond as in an Si atom, and the bond-centered interstitial F atom comes to have the same closed-shell structure as in a rare gas atom. In the Si crystal, it is presumed that, while the rare gas atom with the closed-shell structure is easily diffused, the bond-centered interstitial F atom having come to have the closed-shell structure undergoes structure stabilization by charge transfer with the lattice point N atom. In this connection, it is expected that no non-radiative center attributed to a vacancy or dangling bond would be formed. The reason for this is that neither vacancy nor dangling bond would be formed by the combination of the lattice point N atom with the bond-centered interstitial F atom.

From the inventors' study, it is expected that, when the concentration of the NF pair is low, a radiative center localized in a band gap of silicon would be formed. Further, it is expected that, when the NF pair is present in a high concentration and in a periodic fashion, the wave functions of the localized radiative centers would come to overlap each other, thereby modulating the band structure from the indirect transition to the direct transition.

FIG. 3A illustrates the most stable structure of a silicon matrix semiconductor in which the NF pair is contained in the BC structure, and FIG. 3B shows the band structure thereof. Both have been obtained from the first principle calculation. In FIG. 3B, the band structure of a silicon matrix semiconductor containing no NF pair is also shown by a broken line. FIG. 3B shows that the bottom of conduction band appears at Γc and thus the conversion to direct transition is attained by virtue of the introduction of the NF pair. In short, the occurrence of structural change in the energy level as anticipated has been ascertained by the band calculation. Moreover, it has been found that the most stable structure of the NF pair as also anticipated comprises the lattice point N atom and the bond-centered interstitial F atom. In this most stable structure, the length of the Si—N bond is 3.95 Å, which indicates a significant stretching to about 1.7 times the length of the Si—Si bond (<111>) in Si crystal, 2.35 Å.

In summing up, the principle of silicon band modulation by impurity doping is to modulate the band structure of silicon by introducing an impurity pair in silicon so as to cause an internal stress, thereby attaining a bond stretching.

In particular, the above band calculation results are based on calculation of a system in which one NF pair is introduced in a 64 Si-atom supercell of $2a_0 \times 2a_0 \times 2a_0$, where $a_0$ is a silicon lattice constant determined by calculation the value of which is 5.47 Å. The concentration of NF pair employed in the band calculation is as high as $7.6 \times 10^{20}$ cm$^{-3}$, and a periodic structure is assumed. It is probable for the NF pair structure to be a structure other than the BC structure. The inventors have carried out band calculations with respect to ten or more types of possible NF pair structures, and have ascertained that the BC structure is the most stable.

Incidentally, one of the calculated NF pair structures is an FT structure (filled tetrahedral structure) permitting the conversion to direct transition as in the BC structure. The FT structure when explained with respect to the NF pair is an impurity structure comprising a lattice point N atom and an interstitial tetrahedral site F atom. The length of the Si—N bond is 1.96 Å, which indicates a contraction to about 0.8-fold of the length of the Si—Si bond in Si crystal, 2.35 Å (see JP-A 2007-157749 (KOKAI), JP-A 2007-173590 (KOKAI), JP-A 2007-311493 (KOKAI) and JP-A 2008-91572 (KOKAI)). As apparent from the above, the principles of the conversion to direct transition are different between the FT structure and the BC structure. The band calculation suggests that the BC structure is more stable than the FT structure by 1.8 eV in terms of energy.

(3) Varieties of Impurity Pairs Permitting Band Modulation

In embodiments of the present invention, the following examples can be mentioned as to the combinations of a matrix semiconductor contained in a semiconductor material with a BC structure, a heteroatom A replacing a lattice point and a heteroatom Z to be inserted in a band.

(3-1) The matrix semiconductor is selected from the group consisting of Group IVb elemental semiconductors and Group IVb-IVb compound semiconductors, the heteroatom A is selected from the group consisting of Group IIIb elements, and the heteroatom Z is selected from the group consisting of Group VIIb elements. Especially, an InF pair, an InCl pair, a TlF pair, a TlCl pair and the like are preferred.

(3-2) The matrix semiconductor is selected from the group consisting of Group IVb elemental semiconductors and Group IVb-IVb compound semiconductors, the heteroatom A is selected from the group consisting of Group Vb elements, and the heteroatom Z is selected from the group consisting of Group VIIb elements. Especially, an NF pair, an NCl pair, a BiF pair, a BiCl pair and the like are preferred.

(3-3) The matrix semiconductor is selected from the group consisting of Group IVb elemental semiconductors and Group IVb-IVb compound semiconductors, the heteroatom A is selected from the group consisting of Group IVb elements different from the constituent atoms of the matrix semiconductor, and the heteroatom Z is selected from the group consisting of Group VIb elements. Especially, when the matrix semiconductor is silicon, a CS pair, a CSe pair and the like are preferred. As other desired structures which are not in pair, there can be mentioned a CSC structure in which one bond-centered interstitial S atom is bonded to two lattice point C atoms, a CSeC structure in which one bond-centered interstitial Se atom is bonded to two lattice point C atoms, and the like.

(3-4) The matrix semiconductor is selected from the group consisting of Group IVb elemental semiconductors and Group IVb-IVb compound semiconductors, the heteroatom A is selected from the group consisting of Group IVb elements different from the constituent atoms of the matrix semiconductor, and the heteroatom Z is selected from the group consisting of Group IIa elements and Group IIb elements. Especially, when the matrix semiconductor is silicon, a CMg pair, a CCa pair, a CZn pair and the like are preferred. As other desired structures which are not in pair, there can be mentioned a CMgC structure in which one bond-centered interstitial Mg atom is bonded to two lattice point C atoms, a CCaC structure in which one bond-centered interstitial Ca atom is bonded to two lattice point C atoms, a CZnC structure in which one bond-centered interstitial Zn atom is bonded to two lattice point C atoms, and the like.

As examples of the matrix semiconductors, there can be mentioned the following. The Group IVb elemental semiconductor is selected from the group consisting of diamond, silicon and germanium. The Group IVb-IVb compound semiconductor is selected from the group consisting of SiC, GeC, $Si_xGe_{1-x}$, $Si_xGe_yC_{1-x-y}$, and $Si_xGe_yC_zSn_{1-x-y-z}$.

(4) Structure of Device, and Method of Producing Semiconductor Material with BC Structure The light emitting device according to an embodiment of the present invention comprises a light emitting layer with a BC structure and an n-type electrode and p-type electrode configured to inject electrons and holes in the light emitting layer. The arrangement of the n-type electrode and p-type electrode to the light emitting layer with a BC structure is not particularly limited. FIG. 4A and FIG. 4B are the cross-sectional views of silicon light emitting devices according to embodiments of the present invention. FIG. 4A shows a vertical-type light emitting device and FIG. 4B shows a lateral-type light emitting device.

In the vertical-type light emitting device of FIG. 4A, a light emitting layer 2 with a BC structure and insulating film 3 are stacked on an $n^+$-type region 1. Further, a $p^+$-type region 4 is stacked on the light emitting layer 2 and insulating film 3. That is, the upside and downside of the light emitting layer 2 are in contact with the $p^+$-type region 4 and the $n^+$-type region 1, respectively. An n-type electrode not shown is connected to the $n^+$-type region 1, and a p-type electrode not shown is connected to the $p^+$-type region 4. This light emitting device is supplied with a current in the vertical direction. Electrons are injected from the $n^+$-type region 1 into the light emitting layer 2, and holes are injected from the $p^+$-type region 4 into the light emitting layer 2. Thus, electron-hole recombination and light emission are attained in the light emitting layer 2 with a BC structure of a direct band structure.

In the lateral-type light emitting device of FIG. 4B, a light emitting layer 13 with a BC structure and an $n^+$-type region 14 and a $p^+$-type region 15, arranged so as to sandwich the light emitting layer 13 in the same plane, are stacked on an oxide film 12 of a substrate 11 in a SOI (silicon on insulator) structure. An n-type electrode not shown is connected to the $n^+$-type region 14, and a p-type electrode not shown is connected to the $p^+$-type region 15. This light emitting device is supplied with a current in the lateral direction. Electrons are injected from the $n^+$-type region 14 into the light emitting layer 13, and holes are injected from the $p^+$-type region 15 into the light emitting layer 13. Thus, electron-hole recombination and light emission are attained in the light emitting layer 13 with a BC structure of a direct band structure.

In both the vertical- and lateral-type light emitting devices, any current leakage is prevented by disposing an embedded oxide film. However, the embedded oxide film can be avoided when the current leakage can be prevented by any means, such as a device construction, a substrate resistance or a circuit.

FIG. 4A and FIG. 4B show the fundamental structures of light emitting devices. With respect to practical light emitting devices, various structures are conceivable. For example, the light emitting device according to embodiments of the present invention may be one permitting the extraction of end face light, or one permitting the extraction of surface light. In the instance of the extraction of surface light, the surface may be provided with a transparent electrode. Laser oscillation may be carried out by providing an optical resonator including a mirror surface of low reflectance and a mirror surface of high reflectance paired with an active layer interposed therebetween. These structures can be appropriately combined. Moreover, a light emitting device array may be built by integrating a plurality of light emitting devices on the same substrate. A photoelectric device array may be built by integrating a light emitting device and a transistor on the same substrate. A light emitting/receiving device array may be built by integrating a light emitting device and a light receiving device on the same substrate. An optical device array may be built by integrating a light emitting device, a light receiving device and a waveguide connecting them to each other on the same substrate.

Now, the method of producing a semiconductor material with a BC structure by impurity doping will be described. A main effect of the present invention is that the semiconductor material containing the BC structure of the most stable structure in high proportion exhibits not only high light emission efficiency but also a high absorption coefficient. Two different methods of producing a BC structure through NF doping by way of example will be described in comparison with a method of producing the above-mentioned FT structure.

(4-1) First Method of Producing Semiconductor Material Relating to Formation of BC Structure The first method of producing a semiconductor with a BC structure comprises implanting F ions at high temperatures, implanting N ions at high temperatures, and annealing. By contrast, the method of producing a semiconductor with an FT structure comprises implanting N ions at room temperature, implanting F ions at room temperature, and annealing. In the method of producing a semiconductor with an FT structure, doping with the heteroatom replacing a lattice point (N atom employed in this invention) precedes doping with the heteroatom for insertion in a lattice interstice (F atom employed in this invention). The point is that the first method of producing a BC structure and the method of producing an FT structure are different from each other in the order of implantation of ion species and the temperature of substrate at the time of implantation.

Due to the influence of these differences, the BC structure can be formed at a high yield in the first method of producing a BC structure, while the BC structure is formed only at an extremely low yield of below 1% in the method of producing an FT structure. In this connection, the yield of the BC structure is defined as the ratio of the number of BC structures to the number of ions implanted. In the case of an NF pair, the yield of the BC structure can be calculated by analyzing the vibrational modes of F and N by infrared spectroscopy (IR). The inventors' study has revealed that the yield of the BC structure is highly dependent upon the processes, i.e., the order of implantation of ion species and substrate temperature at the time of implantation. It is presumed that this is due to the following reasons.

FIGS. 5A to 5C are schematic views showing changes of the impurity arrangement in the production method for the FT structure. Referring to FIG. 5A, in the method of producing the FT structure, N ions are implanted at room temperature prior to the implantation of F ions, so that N ions expected to replace lattice points are likely to become interstitial N atoms in the silicon. Further, these interstitial N atoms are likely to pair with each other, thereby assuming a stable structure known as an NN pair (J. L. McAfee et al., Phys. Rev. B 69, 165206 (2004)). Now referring to FIG. 5B, even if F ions are implanted at room temperature after the formation of the NN pair, the NN pair is so stable that the yield of the BC structure would be an extremely small value of below 1%. Further referring to FIG. 5C, annealing is performed so as to attain defect recovery and structural change. However, the NN pair is so stable that decomposition of the NN pair leading to structural change to the BC structure would be rare. Therefore, due to these mechanisms, it is presumed that the final yield of the BC structure would remain at an extremely small value of below 1%.

Figure 6B:
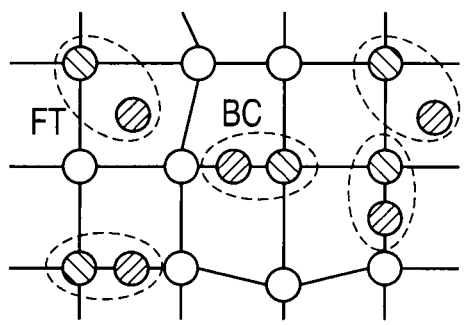
Figure 6C:
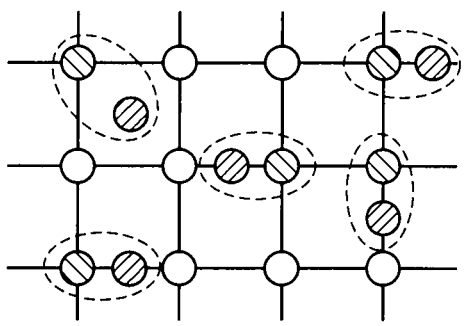

FIGS. 6A to 6C are schematic views showing changes of the impurity arrangement in the first production method of the BC structure. Referring to FIG. 6A, when F ions are implanted prior to the implantation of N ions at such high temperatures that no diffusion occurs, desired bond-centered interstitial F atoms are formed at a certain yield. Referring to FIG. 6B, when N ions are subsequently implanted at such high temperatures that no diffusion occurs, F captures an N ion with a certain capture cross section to thereby form a pair. As the most stable structure of the NF pair is the BC structure, many of the formed NF pairs relax into the BC structure while experiencing thermal motions. Referring to FIG. 6C, finally, annealing is performed so as to attain defect recovery and structural change. At that time, a proportion of the NF pairs having relaxed to the metastable FT structure relax into the most stable BC structure while re-experiencing thermal motions. It is presumed that the final yield of the BC structure would be a high value due to these mechanisms.

The yield of the BC structure can be calculated by the following formulae.

When $A\{Fbc\} > A\{Ns\}$, where $A\{Fbc\}$ is the number of bond-centered interstitial F atoms and $A\{Ns\}$ is the number of lattice point N atoms, Yield of the BC structure=$A\{Ns\}/A\{ion\}$.

When $A\{Fbc\} < A\{Ns\}$, where $A\{Fbc\}$ is the number of bond-centered interstitial F atoms and $A\{Ns\}$ is the number of lattice point N atoms, Yield of the BC structure=$A\{Fbc\}/A\{ion\}$.

In the above formulae, $A\{ion\}$ is the number of atoms of implanted N ions or F ions, whichever fewer.

The above $A\{Fbc\}$ and $A\{Ns\}$ are determined in the following manner. First, $A\{Fbc\}$ will be described. The three structures SiF, $SiF_2$ and $SiF_4$ are known as main structures that can be assumed by F atoms in the silicon crystal. Among them, SiF corresponds to the bond-centered interstitial F atom. On the IR spectrum, the bond-centered interstitial F atom, $SiF_2$ and $SiF_4$ exhibit peaks at 830±30 cm$^{-1}$, 930±30 cm$^{-1}$ and 1010±30 cm$^{-1}$, respectively. When the peak intensities at 830±30 cm$^{-1}$, 930±30 cm$^{-1}$ and 1010±30 cm$^{-1}$ are referred to as α, β and γ, respectively, the ratio of bond-centered interstitial F atoms can be expressed by the formula $\alpha/(\alpha+\beta+\gamma)$. Therefore, the number of bond-centered interstitial F atoms can be expressed by the formula:

$\alpha/(\alpha+\beta+\gamma) \times A\{Fion\}$, where $A\{Fion\}$ is the number of implanted F ions.

Now, $A\{Ns\}$ will be described. The main structures that can be assumed by N atoms in the silicon crystal are two structures of the lattice point N and NN pair. On the IR spectrum, the lattice point N and NN pair exhibit peaks at 650±30 cm$^{-1}$ and 960±30 cm$^{-1}$, respectively. When the peak intensities at 650±30 cm$^{-1}$ and 960±30 cm$^{-1}$ are referred to as α and β, respectively, the ratio of lattice point N can be expressed by the formula: $\alpha/(\alpha+\beta)$. Therefore, the number of lattice point N atoms can be expressed by the formula:

$\alpha/(\alpha+\beta) \times A\{Nion\}$, where $A\{Nion\}$ is the number of implanted N ions.

The above applies to the NF impurity whose IR spectrum is identified. With respect to other impurity atom combinations whose IR spectrum is not specified, a ratio of any desired structure ratio can be determined by analyzing the bonding state by X-ray photoelectron spectroscopy, for example, $\alpha/(\alpha+\beta+\gamma)$ with respect to the above F.

(4-2) Second Method of Producing Semiconductor Material Relating to Formation of BC Structure The second method of producing a semiconductor with a BC structure comprises implanting F ions and N ions so that the ratio defined by the formula $A\{Fion\}/A\{Nion\}$, where $A\{Fion\}$ is the number of implanted F ions and $A\{Nion\}$ is the number of implanted N ions, is 5 or greater. By contrast, in the method of producing a semiconductor with an FT structure, the ratio of interstitially inserted heteroatoms (F atoms in the present invention) to heteroatoms replacing lattice points (N atoms in the present invention) is in the range of 0.5 to 2. In essence, the second production method of the BC structure is different from the production method of the FT structure in the ratio of implanted ions.

Due to the influence of this difference, the BC structure can be formed at a high yield in the second production method of the BC structure, while the BC structure is formed only at an extremely low yield of below 1% in the production method of the FT structure. The inventors' study has revealed that the yield of the BC structure is highly dependent upon the process, i.e., the ratio of implanted ions. It is presumed that this is due to the following reason.

FIGS. 5A to 5C, as aforementioned, are schematic views showing changes of the impurity arrangement in the production method of the FT structure. In FIGS. 5A to 5C, the number of N atoms is equal to the number of F atoms. A certain N atom is noted under the condition that both the atom numbers are equal to each other. The probability that the heteroatom (N atom or F atom in this case) adjacent to the N atom is an N atom is nearly equal to the probability that the heteroatom is an F atom. Referring to FIG. 5C, defect recovery and structural change are effected by annealing. However, the structural change to the BC structure through decomposition of the NN pair is quite rare because the NN pair is stable and because the number of F atoms and the number of N atoms are in the same range with the result that the frequency of collision between the NN pair and F atoms is low. Therefore, it is presumed that the final yield of the BC structure would remain at an extremely small value of below 1%.

In the second production method of the BC structure, it is intended to induce the desired structural change to the BC structure by increasing the amount of implanted F ions. Although this method is identical to the production method of the FT structure in that defect recovery and structural change are effected by annealing, this method enables to attain relaxation to the most stable BC structure because the NN pair collides with a many number of F atoms by virtue of increase of the ratio of F ions to N ions to 5 or greater. It is presumed that the final yield of the BC structure would be a high value due to this mechanism.

In connection with the second production method of the BC structure, the yield of the BC structure can be enhanced by implanting Si ions or the like in the surface of a matrix semiconductor to thereby render the matrix semiconductor amorphous prior to the N ion implantation and F ion implantation. It is presumed that the reason for the enhancement of the yield of the BC structure by rendering the matrix semiconductor amorphous would be that, although recrystallization from amorphous state to crystalline state in a solid phase would be induced by annealing, the N atom in the amorphous state has no distinction between the lattice point and the interstices and, at the time of solid-phase recrystallization, the ratio of the number of N atoms replacing lattice points would be increased to thereby achieve increase of the yield of the BC structure.

Furthermore, the yield of the BC structure can be enhanced by a combination of the first and second production methods for the BC structure. In essence, the implantation of F ions precedes the implantation of N ions, and the amount of implanted F ions is increased so as to be as large as at least 5 times that of N ions.

As apparent from the foregoing, in the first production method, the yield of the BC structure can be enhanced by changing the order of ion implantation and the substrate temperature at the time of implantation. In the second production method, the yield of the BC structure can also be enhanced by increasing the implantation amount of interstitially inserted impurity relative to the impurity replacing lattice points. Accordingly, formation of a light emitting layer and photoelectric conversion layer having the BC structure in a matrix semiconductor can be achieved. Incidentally, during crystal growth by a process such as CVD, a semiconductor with the BC structure may be formed. Also, semiconductors with the BC structure may be formed by use of other processes.

Now, particular embodiments of the present invention will be described.

First Embodiment

A lateral-type light emitting device with the structure shown in FIG. 4B will be described. Using silicon as a matrix semiconductor, an N atom as a heteroatom A replacing a lattice point site and an F atom as a heteroatom Z to be inserted in a bond-centered interstitial site, and processes including resist application, patterning, ion implantation and PEP were carried out, thereby forming an NF doped Si light emitting layer. Both the N concentration and F concentration in the layer were $2.0 \times 10^{20}/cm^3$.

The doping of the active layer with N and F was carried out by ion implantation. The concentration of NF pair estimated from IR was $1.0 \times 10^{20}/cm^3$. The implantation of F ions preceded the implantation of N ions. As examples of the implantation conditions, the substrate temperature at the time of F implantation was 400° C., and the substrate temperature at the time of N implantation was 600° C. After the ion implantation, annealing was carried out at 900° C. for 30 seconds in order to enhance the yield of the BC structure and to achieve recovery from any crystal lattice disorder caused by the ion implantation. With respect to the substrate temperature at the time of ion implantation, a temperature not altering an implantation distribution, i.e., a temperature ensuring a small diffusion length relative to the implantation distribution, should be selected. The substrate temperatures herein were selected so as to satisfy this requirement.

When the NF doped Si of the light emitting layer was photoexcited, strong PL emission occurred in a wavelength range of 1.5 μm to 1.6 μm. Phonon-assisted emission corresponding to inter-band emission of crystalline silicon occurred at a 1.1 μm band. As seen from the band calculation results of FIG. 3B, the band gap of NF doped Si in which the NF pairs are present in high concentration and exhibit periodicity is smaller than that of crystalline silicon. Accordingly, that the wavelength of observed PL emission is longer than the wavelength of phonon-assisted emission agrees to the result just expected from the band calculation. Therefore, it is considered that in the light emitting layer the NF pairs with the BC structure are formed in high concentration, changing to a direct band structure.

Recombination emission excited by current could be generated by current-driving the resultant light emitting device to inject holes from the $p^+$ region into the active layer and to inject electrons from the $n^+$ region into the active layer.

It is apparent from the above that the bond stretching by impurity doping is a very effective approach as a band engineering technique for providing an indirect semiconductor with light emission capability.

Comparative Example 1

A device with exactly the same construction as in the First Embodiment was fabricated except that a B atom was used in place of the F atom as a heteroatom Z inserted in an interstitial site in the active layer. The B concentration was $2.0 \times 10^{20}/cm^3$ equal to the F concentration in the First Embodiment.

A current was injected in this device to examine whether emission was detected. As a result, it was found that the device of this Comparative Example 1 did not emit light even upon current injection. Further, the light emitting layer was photoexcited, and it was found that no emission occurred.

The reason for no emission would concern the position of B atom in the crystal. As well known, the B atom is a typical p-type dopant and regularly replaces a lattice point site not the bond-centered interstitial site. Accordingly, while there is the possibility that the B atom and the P atom pair with each other through charge compensation, they would not form the BC structure.

From the above, it is apparent that for forming the BC structure and inducing a direct band structure in the matrix semiconductor, heteroatoms should be selected in consideration of a combination of a heteroatom replacing a lattice point site with a heteroatom to be inserted in a bond-centered interstitial site.

Comparative Example 2

A device having the active layer of the FT structure was fabricated by exactly the same scheme as in the First Embodiment except that the ion implantation of an N atom as the heteroatom A replacing a lattice point site preceded the ion implantation of an F atom as the heteroatom Z to be inserted in a bond-centered interstitial site. Specifically, the implantation of N ions was carried out at room temperature, subsequently the implantation of F ions was carried out at room temperature, and then annealing was carried out at 900° C. for 5 minutes.

A current was injected in this device to examine whether emission was detected. As a result, it was found that, while the device of Comparative Example 2 emitted light upon current injection, the emission intensity was as low as about 1/100 of that of the First Embodiment. The yield of the BC structure was measured and was found to be below the measurement limit 0.5%.

From the above, it is apparent that the efficient formation of the BC structure is essential for obtaining an active layer ensuring intense emission, and that the ion implantation of the heteroatom Z should precede the ion implantation of the heteroatom A for that.

Comparative Example 3

A device was fabricated by the same scheme as in the First Embodiment except that the active layer was first rendered amorphous by the implantation of Si ions, subsequently the ion implantation of N atoms as the heteroatom A replacing a lattice point site was carried out and then the ion implantation of F atoms as the heteroatom Z to be inserted in a bond-centered interstitial site was carried out at a concentration of 10 times the number of N atoms. Specifically, the ion implantation of Si was first carried out at room temperature in an amount of $3\times10^{15}/cm^2$, thereby rendering the active layer amorphous. Subsequently, the ion implantation of N atoms was carried out at room temperature so that the N concentration was $2.5\times10^{19}/cm^3$. Further, the ion implantation of F atoms was carried out at room temperature so that the F concentration was $2.5\times10^{20}/cm^3$, and annealing was carried out at 900° C. for 5 minutes.

A current was injected in this device to examine whether emission was detected. As a result, it was found that emission was detected from the device of Comparative Example 3 and that the emission intensity was as high as about a half of that of the First Embodiment. The yield of the BC structure was determined by IR, and it was found that the concentration of NF pair was $2.0\times10^{19}/cm^3$.

From the above, it is apparent that the efficient formation of the BC structure is essential for obtaining an active layer ensuring intense emission, and that the production method in which the amount of heteroatom Z implanted is increased relative to that of the heteroatom A, as different that of the First Embodiment, is also efficient.

Second Embodiment

A light emitting device with exactly the same construction as in the First Embodiment was fabricated except that a C atom was used as a heteroatom A and an S atom was used as a heteroatom Z. The C concentration and S concentration were $3.0\times10^{20}/cm^3$ and $2.0\times10^{20}/cm^3$, respectively. Both a CS pair and a CSC structure were formed. The total concentration of (CS+CSC) was $5\times10^{19}/cm^3$. The C concentration, S concentration and (CS+CSC) concentration can be estimated by XPS.

The doping of the active layer with C and S was carried out by ion implantation. The implantation of S ions preceded the implantation of C ions. The substrate temperature at the implantation of S ions was 400° C. and the substrate temperature at the implantation of C ions was 600° C. After the ion implantation, annealing was performed at 1000° C. for one minute.

When the light emitting device was photoexcited, PL emission occurred in a wavelength range of 1.5 μm band. When this device was current-driven, current-injected emission could be generated from the light emitting layer. The wavelength of the current-injected emission was also in a 1.5 μm band, exhibiting emission spectrum with a form similar to that of the PL emission spectrum.

As apparent from this embodiment, even when the combination of heteroatom A and heteroatom Z is that of a Group IVb element and a Group VIa element, the combination imparts emission capability to the indirect semiconductor.

Third Embodiment

A lateral-type light receiving device with the structure shown in FIG. 4B will be described. Using silicon as a matrix semiconductor, an In atom as a heteroatom A replacing a lattice point site and an F atom as a heteroatom Z to be inserted in a bond-centered interstitial site, and processes including resist application, patterning, ion implantation and PEP were carried out, thereby forming an InF doped Si photoelectric conversion layer. The InF pair concentration in the layer was $2.0\times10^{20}/cm^3$.

The doping of the active layer with In and F was carried out by ion implantation. The implantation of F ions preceded the implantation of In ions. The substrate temperature at the time of F implantation was 400° C. and the substrate temperature at the time of In implantation was 600° C. After the ion implantation, annealing was carried out at 900° C. for 30 seconds.

A band calculation, not shown as a drawing, suggests that the band gap of InF doped Si is slightly narrower than that of NF doped Si. When the light receiving device is irradiated with light having energy over the band gap to thereby photoexcite the InF doped Si of the photoelectric conversion layer, a photocurrent would be generated.

Upon incidence of light signals of with a wavelength of 1.5 μm band modulated at 10 GHz on this light receiving device, there was obtained an output photocurrent with a high sensitivity of 0.8 A/W. In this manner, with the use of the light receiving device of this embodiment, a high-speed photodetection can be achieved for near-infrared rays with a wavelength of 1.5 μm band for which the crystalline silicon has no sensitivity.

Therefore, it is apparent that the bond stretching by impurity doping by which a modulation of energy band is achieved provides a very effective method as a technique for imparting a intense light absorption capability to the photoelectric conversion layer of the light receiving device comprising silicon to thereby impart a high-speed and high-sensitive response to the device.

Fourth Embodiment

A light receiving device with the same construction as in the Third Embodiment was fabricated except that a C atom was used as a heteroatom A and an Mg atom was used as a heteroatom Z. The C concentration and Mg concentration were $3.0\times10^{20}/cm^3$ and $2.0\times10^{20}/cm^3$, respectively. Both a CMg pair and a CMgC structure were formed. The total concentration of (CMg+CMgC) was $3\times10^{19}/cm^3$. The C concentration, Mg concentration and (CMg+CMgC) concentration can be estimated by XPS.

The doping of the active layer with C and Mg was carried out by ion implantation. The implantation of Mg ions preceded the implantation of C ions. The substrate temperature at the implantation of Mg ions was 400° C. and the substrate temperature at the implantation of C ions was 600° C. After the ion implantation, annealing was performed at 900° C. for 30 seconds.

A band calculation suggests that the band gap of CMg doped Si is approximately equal to that of InF doped Si. When the light receiving device is irradiated with light having energy over the band gap to thereby photoexcite the CMg doped Si of the photoelectric conversion layer, a photocurrent would be generated.

Upon incidence of light signals with a wavelength of 1.3 μm band modulated at 10 GHz on this light receiving device, there was obtained an output photocurrent with a high sensitivity of 0.5 A/W. In this manner, with the use of the light receiving device of this embodiment, a high-speed photodetection can be achieved for near-infrared rays of a wavelength of 1.3 μm band for which the crystalline silicon has no sensitivity.

As apparent from this embodiment, even when the combination of heteroatom A and heteroatom Z is that of a Group IVb element and a Group IIa element, the BC structure would be formed in the photoelectric conversion layer to thereby achieve an increase of light absorption. As a result, a high-speed and high-sensitive response of the light receiving device can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor material comprising:
    a matrix semiconductor comprising constituent atoms bonded to each other into a tetrahedral bond structure; and
    a heteroatom Z doped to the matrix semiconductor,
    the heteroatom Z being inserted in a bond so as to form a bond-center structure with an stretched bond length, and the bond-center structure being contained in a proportion of 1% or more based on the heteroatom Z.

2. The semiconductor material according to claim 1, further comprising a heteroatom A replacing a lattice point of the matrix semiconductor, wherein the matrix semiconductor is selected from the group consisting of Group IVb elemental semiconductors and Group IVb-IVb compound semiconductors, the heteroatom Z is selected from the group consisting of Group VIIb elements, and the heteroatom A is selected from the group consisting of Group IIIb elements and provides charge compensation with the heteroatom Z.

3. The semiconductor material according to claim 1, further comprising a heteroatom A replacing a lattice point of the matrix semiconductor, wherein the matrix semiconductor is selected from the group consisting of Group IVb elemental semiconductors and Group IVb-IVb compound semiconductors, the heteroatom Z is selected from the group consisting of Group VIIb elements, and the heteroatom A is selected from the group consisting of Group Vb elements and provides charge compensation with the heteroatom Z.

4. The semiconductor material according to claim 1, further comprising a heteroatom A replacing a lattice point of the matrix semiconductor, wherein the matrix semiconductor is selected from the group consisting of Group IVb elemental semiconductors and Group IVb-IVb compound semiconductors, the heteroatom Z is selected from the group consisting of Group VIb elements, and the heteroatom A is selected from the group consisting of Group IVb elements different from the constituent atoms of the matrix semiconductor.

5. The semiconductor material according to claim 1, further comprising a heteroatom A replacing a lattice point of the matrix semiconductor, wherein the matrix semiconductor is selected from the group consisting of Group IVb elemental semiconductors and Group IVb-IVb compound semiconductors, the heteroatom Z is selected from the group consisting of Group IIa elements and Group IIb elements, and the heteroatom A is selected from the group consisting of Group IVb elements different from the constituent atoms of the matrix semiconductor.

6. A light emitting device comprising:
    a light emitting layer comprising the semiconductor material according to claim 1, and
    an n-type electrode and p-type electrode configured to inject a current in the light emitting layer.

7. A light receiving device comprising:
    a photoelectric conversion layer comprising the semiconductor material according to claim 1, and
    an n-type electrode and p-type electrode configured to extract a photocurrent from the photoelectric conversion layer.

8. A semiconductor material comprising:
    a matrix semiconductor comprising constituent atoms bonded to each other into a tetrahedral bond structure; and
    a heteroatom Z doped to the matrix semiconductor,
    the heteroatom Z being inserted in a bond so as to form a bond-center structure with an stretched bond length, the bond-center structure not containing vacancy or dangling bond, and the bond-center structure being contained in a proportion of 1% or more based on the heteroatom Z.

* * * * *